(12) United States Patent
Liao

(10) Patent No.: US 10,304,991 B2
(45) Date of Patent: May 28, 2019

(54) CHIP MOUNTING SYSTEM AND METHOD FOR MOUNTING CHIPS

(71) Applicant: ASTI GLOBAL INC., TAIWAN, Changhua County (TW)

(72) Inventor: Chien-Shou Liao, New Taipei (TW)

(73) Assignee: ASTI GLOBAL INC., TAIWAN, Changhua County (TW)

( * ) Notice: Subject to any disclaimer, the term of this patent is extended or adjusted under 35 U.S.C. 154(b) by 0 days.

(21) Appl. No.: 15/866,993

(22) Filed: Jan. 10, 2018

(65) Prior Publication Data

US 2018/0358508 A1  Dec. 13, 2018

(30) Foreign Application Priority Data

Jun. 7, 2017  (TW) .............................. 106118873 A

(51) Int. Cl.
*H01L 33/00* (2010.01)
*H01L 33/62* (2010.01)
(Continued)

(52) U.S. Cl.
CPC ........ *H01L 33/0075* (2013.01); *H01L 21/673* (2013.01); *H01L 21/67011* (2013.01); *H01L 21/6734* (2013.01); *H01L 21/67121* (2013.01); *H01L 21/67132* (2013.01); *H01L 21/67144* (2013.01); *H01L 21/67155* (2013.01);
(Continued)

(58) Field of Classification Search
CPC ............ H01L 33/0075; H01L 21/6734; H01L 21/6838; H01L 21/687; H01L 21/6835; H01L 21/67242; H01L 21/67271; H01L 21/67259; H01L 21/67333; H01L 21/673; H01L 21/67132; H01L 21/67155; H01L 21/67011; H01L 21/67144; H01L 21/67121; H01L 25/0753
See application file for complete search history.

(56) References Cited

U.S. PATENT DOCUMENTS 9,716,085 B2 * 7/2017 Li ........................... H01L 24/00
9,842,782 B2 * 12/2017 Chen ................. H01L 21/67144
(Continued)

FOREIGN PATENT DOCUMENTS

TW  201327910 A1  7/2013

*Primary Examiner* — Bac H Au
(74) *Attorney, Agent, or Firm* — Li & Cai Intellectual Property (USA) Office

(57) ABSTRACT

The present invention provides a chip mounting system and a method for mounting chips. The chip mounting system includes a first carrier device, a second carrier device, and a chip capturing device. The first carrier device includes a plurality of first carrier platforms for respectively carrying a plurality of semiconductor structures. Each semiconductor structure includes a base layer and a plurality of light emitting chips disposed on the base layer. The second carrier device includes a second carrier platform for carrying a circuit substrate. The chip capturing device is used for moving the light emitting chip from the base layer to the circuit substrate. The red, the green, and the blue light-emitting groups of the same sequence are disposed adjacent to each other, so that the red, the green, and the blue light-emitting chips of the same sequence are arranged adjacent to each other to form a pixel.

10 Claims, 12 Drawing Sheets

(51) Int. Cl.
*H01L 33/32* (2010.01)
*H01L 25/075* (2006.01)
*H01L 21/67* (2006.01)
*H01L 21/673* (2006.01)
*H01L 21/683* (2006.01)
*H01L 21/687* (2006.01)
*H01L 25/00* (2006.01)

(52) U.S. Cl.
CPC .. *H01L 21/67242* (2013.01); *H01L 21/67259* (2013.01); *H01L 21/67271* (2013.01); *H01L 21/67333* (2013.01); *H01L 21/687* (2013.01); *H01L 21/6835* (2013.01); *H01L 21/6838* (2013.01); *H01L 25/0753* (2013.01); *H01L 33/32* (2013.01); *H01L 33/62* (2013.01); *H01L 25/50* (2013.01); *H01L 2933/0033* (2013.01)

(56) References Cited

U.S. PATENT DOCUMENTS

| | | | |
|---|---|---|---|
| 9,893,041 B2* | 2/2018 | Pokhriyal | H01L 21/6835 |
| 9,941,259 B2* | 4/2018 | Yoo | H05K 999/99 |
| 10,109,658 B2* | 10/2018 | Jeong | H01L 33/62 |
| 2017/0345692 A1* | 11/2017 | Liu | H01L 21/67144 |
| 2017/0358623 A1* | 12/2017 | Thothadri | H01L 27/156 |
| 2018/0068995 A1* | 3/2018 | Kajiyama | H01L 25/0753 |
| 2018/0096977 A1* | 4/2018 | Ahmed | H01L 25/13 |
| 2018/0138357 A1* | 5/2018 | Henley | H01L 25/0753 |
| 2018/0366450 A1* | 12/2018 | Gardner | H01L 25/0753 |
| 2018/0374738 A1* | 12/2018 | Lee | H01L 21/6835 |

* cited by examiner

CHIP MOUNTING SYSTEM AND METHOD FOR MOUNTING CHIPS

FIELD OF THE INVENTION

The present disclosure relates to a mounting system and a mounting method, and more particularly to a chip mounting system and a method for mounting chips.

BACKGROUND OF THE INVENTION

In recent years, LEDs (light-emitting diodes) have been widely used due to good light-emitting quality and high light-emitting efficiency. LEDs have been developed to be capable of emitting red, green, and blue light, and LEDs have been increasingly used in various applications such as a full-color LED display, so that color performance of the full-color LED display can be increased. Typically, the red, green, and blue lights respectively generated by the red, green, and blue LEDs blend to form colored light with high brightness and contrast, so as to display information for viewers.

SUMMARY OF THE INVENTION

One aspect of the present disclosure relates to a chip mounting system and a method for mounting chips.

One of the embodiments of the present disclosure provides a chip mounting system that includes a first carrier device, a second carrier device, and a chip capturing device. The first carrier device includes a plurality of first carrier platforms for respectively carrying a plurality of semiconductor structures. Each semiconductor structure includes a base layer and a plurality of light emitting groups disposed on the base layer in parallel, and each light emitting group includes a plurality of light emitting chips disposed on the base layer. The second carrier device includes a second carrier platform for carrying a circuit substrate. The chip capturing device is used for moving the light emitting chip from the base layer to the circuit substrate.

Another one of the embodiments of the present disclosure provides a chip mounting system that includes a first carrier device, a second carrier device, and a chip capturing device. The first carrier device includes a plurality of first carrier platforms for respectively carrying a plurality of semiconductor structures. Each semiconductor structure includes a base layer and a plurality of light emitting chips disposed on the base layer. The second carrier device includes a second carrier platform for carrying a circuit substrate. The chip capturing device is used for moving the light emitting chip from the base layer to the circuit substrate.

Yet another one of the embodiments of the present disclosure provides a method for mounting chips, including: providing a first carrier device that includes a plurality of first carrier platforms for respectively carrying a plurality of semiconductor structures, wherein each semiconductor structure includes a base layer and a plurality of light emitting groups disposed on the base layer in parallel, and each light emitting group includes a plurality of light emitting chips disposed on the base layer; and then moving the light emitting chip from the base layer to the circuit substrate by a chip capturing device.

More particularly, the first carrier device and the chip capturing device are disposed on the same production line, and the semiconductor structures are divided into a first semiconductor structure, a second semiconductor structure and a third semiconductor structure.

More particularly, each light emitting group of the first semiconductor structure is a red light emitting group, each light emitting chip of the first semiconductor structure is a red light emitting chip, and the sequence of the red light emitting groups of the first semiconductor structure is based upon the arithmetical series with a common difference of 1 being sequentially defined as the $1^{st}$, $2^{nd}$, $3^{rd}$, ... $n^{th}$.

More particularly, each light emitting group of the second semiconductor structure is a green light emitting group, each light emitting chip of the second semiconductor structure is a green light emitting chip, and the sequence of the green light emitting groups of the second semiconductor structure is based upon the arithmetical series with a common difference of 1 being sequentially defined as the $1^{st}$, $2^{nd}$, $3^{rd}$, ... $n^{th}$.

More particularly, each light emitting group of the third semiconductor structure is a blue light emitting group, each light emitting chip of the third semiconductor structure is a blue light emitting chip, and the sequence of the blue light emitting groups of the third semiconductor structure is based upon the arithmetical series with a common difference of 1 being sequentially defined as the $1^{st}$, $2^{nd}$, $3^{rd}$, ... $n^{th}$.

More particularly, the red light emitting chip of the first semiconductor structure is transmitted from the base layer to the circuit substrate, the green light emitting chip of the second semiconductor structure is transmitted from the base layer to the circuit substrate, and the blue light emitting chip of the third semiconductor structure is transmitted from the base layer to the circuit substrate.

Therefore, the red light emitting group, the green light-emitting group, and the blue light-emitting group of the same sequence are disposed adjacent to each other and electrically connected to the circuit substrate due to the feature of "the chip capturing device being used for moving the light emitting chip from the base layer to the circuit substrate" or "moving the light emitting chip from the base layer to the circuit substrate by a chip capturing device", so that the red light-emitting chip, the green light-emitting chip, and the blue light-emitting chip of the same sequence are arranged adjacent to each other to form a pixel.

To further understand the techniques, means and effects of the present disclosure, the following detailed descriptions and appended drawings are hereby referred to, such that, and through which, the purposes, features and aspects of the present disclosure can be thoroughly and concretely appreciated. However, the appended drawings are provided solely for reference and illustration, without any intention to limit the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DETAILED DESCRIPTION OF THE PREFERRED EMBODIMENTS

Embodiments of a chip mounting system and a method for mounting chips according to the present disclosure are described herein. Other advantages and objectives of the present disclosure can be easily understood by one skilled in the art from the disclosure. The present disclosure can be applied in different embodiments. Various modifications and variations can be made to various details in the description for different applications without departing from the scope of the present disclosure. The drawings of the present disclosure are provided only for simple illustrations, but are not drawn to scale and do not reflect the actual relative dimensions. The following embodiments are provided to describe in detail the concept of the present disclosure, and are not intended to limit the scope thereof in any way.

Referring to FIG. 1 to FIG. 8, the present disclosure provides a chip mounting system that includes a first carrier device D1 (or a first bearing device), a second carrier device D2 (or a second bearing device) and a chip capturing device D3. The first carrier device D1, the second carrier device D2, and the chip capturing device D3 are disposed on the same production line.

Figure 1:
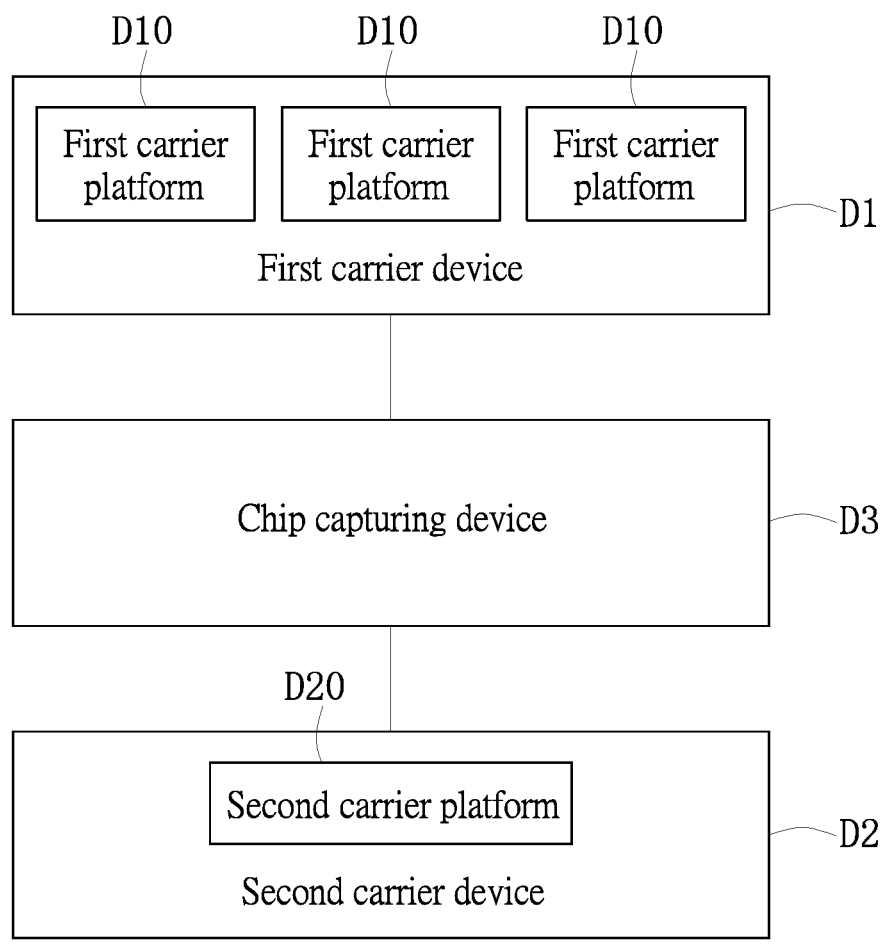
FIG. 1 shows a function block of a chip mounting system according to the present disclosure.
Figure 2:
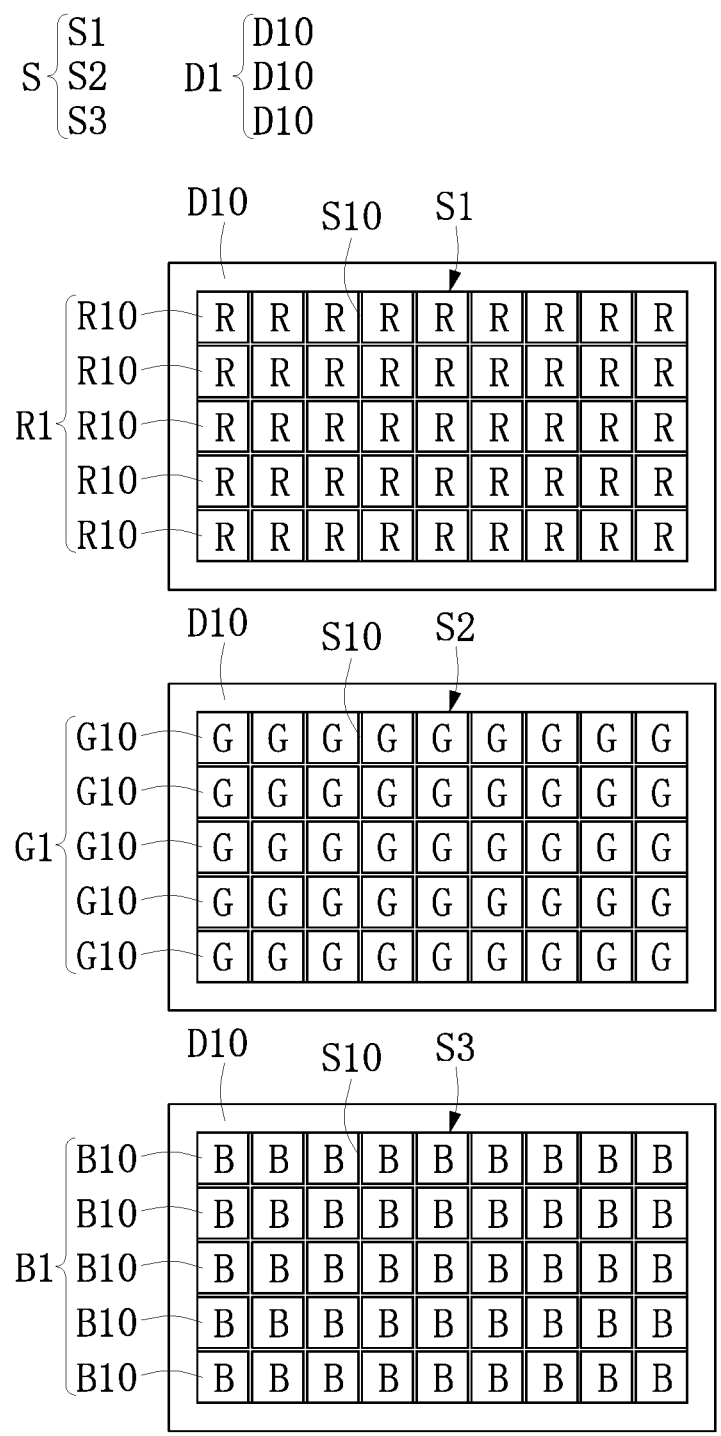
FIG. 2 shows a top schematic view of a first carrier device including a plurality of first carrier platforms for respectively carrying a plurality of semiconductor structures according to the present disclosure.

Firstly, referring to FIG. 1 and FIG. 2, the first carrier device D1 includes a plurality of first carrier platforms D10 for respectively carrying a plurality of semiconductor structures S. More particularly, referring to FIG. 2 and FIG. 10, each semiconductor structure S includes a base layer S10 and a plurality of light emitting groups disposed on the base layer S10 in parallel, and each light emitting group includes a plurality of light emitting chips S11 disposed on the base layer S10. In addition, the semiconductor structures S can be divided into a first semiconductor structure S1, a second semiconductor structure S2 and a third semiconductor structure S3.

For example, as shown in FIG. 2, each light emitting group of the first semiconductor structure S1 may be a red light emitting group R1, and each light emitting chip of the first semiconductor structure S1 may be a red light emitting chip R10. In addition, the red light emitting groups R1 of the first semiconductor structure S1 can be based upon the arithmetical series with a common difference of 1 being sequentially defined as the $1^{st}$, $2^{nd}$, $3^{rd}$, ... $n^{th}$. That is to say, the red light emitting groups R1 are sequentially arranged from left to right in FIG. 2, so that the red light emitting groups R1 are sequentially defined as the $1^{st}$ red light emitting group R1, the $2^{nd}$ red light emitting group R1, the $3^{rd}$ red light emitting group R1, ... the $n^{th}$ red light emitting group R1.

For example, as shown in FIG. 2, each light emitting group of the second semiconductor structure S2 may be a green light emitting group G1, and each light emitting chip of the second semiconductor structure S2 may be a green light emitting chip G10. In addition, the green light emitting groups G1 of the second semiconductor structure S2 can be based upon the arithmetical series with a common difference of 1 being sequentially defined as the $1^{st}$, $2^{nd}$, $3^{rd}$, ... $n^{th}$. That is to say, the green light emitting groups G1 are sequentially arranged from left to right in FIG. 2, so that the green light emitting groups G1 are sequentially defined as the $1^{st}$ green light emitting group G1, the $2^{nd}$ green light emitting group G1, the $3^{rd}$ green light emitting group G1, ... the $n^{th}$ green light emitting group G1.

For example, as shown in FIG. 2, each light emitting group of the third semiconductor structure S3 may be a blue light emitting group B1, and each light emitting chip of the third semiconductor structure S3 may be a blue light emitting chip B10. In addition, the blue light emitting groups B1 of the third semiconductor structure S3 can be based upon the arithmetical series with a common difference of 1 being sequentially defined as the $1^{st}$, $2^{nd}$, $3^{rd}$, ... $n^{th}$. That is to say, the blue light emitting groups B1 are sequentially arranged from left to right in FIG. 2, so that the blue light emitting groups B1 are sequentially defined as the $1^{st}$ blue light emitting group B1, the $2^{nd}$ blue light emitting group B1, the $3^{rd}$ blue light emitting group B1, ... the $n^{th}$ blue light emitting group B1.

Figure 4:
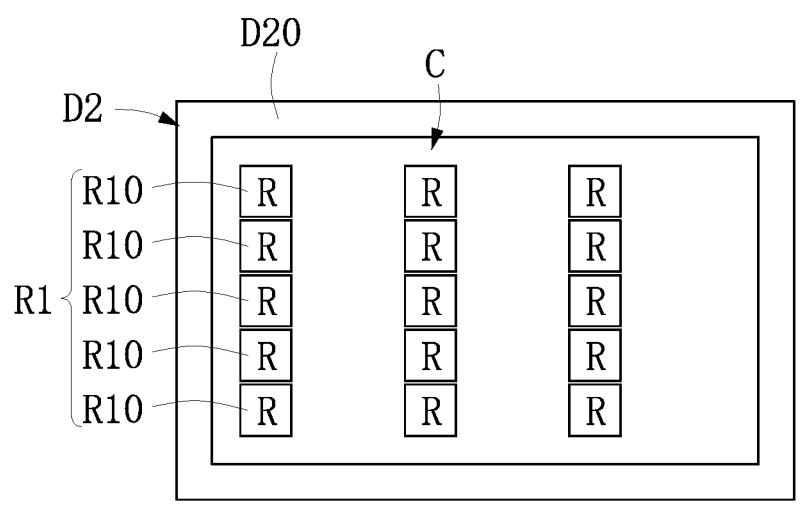
FIG. 4 shows a top schematic view of the $1^{st}$, $4^{th}$ and $7^{th}$ red light emitting groups of the first semiconductor structure transmitted to circuit substrate by the chip capturing device according to the present disclosure.
Figure 5:
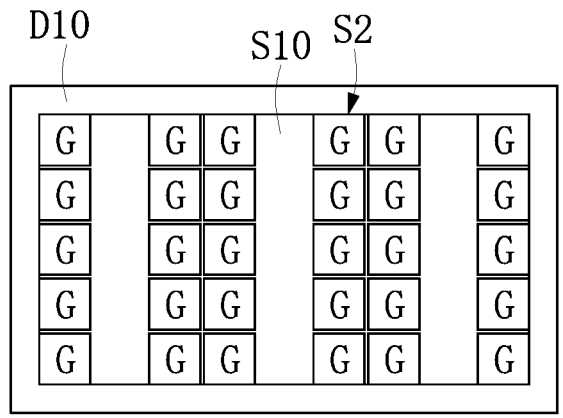
FIG. 5 shows a top schematic view of the $2^{nd}$, $5^{th}$ and $8^{th}$ red light emitting groups of the first semiconductor structure removed from the base layer by the chip capturing device according to the present disclosure.
Figure 6:
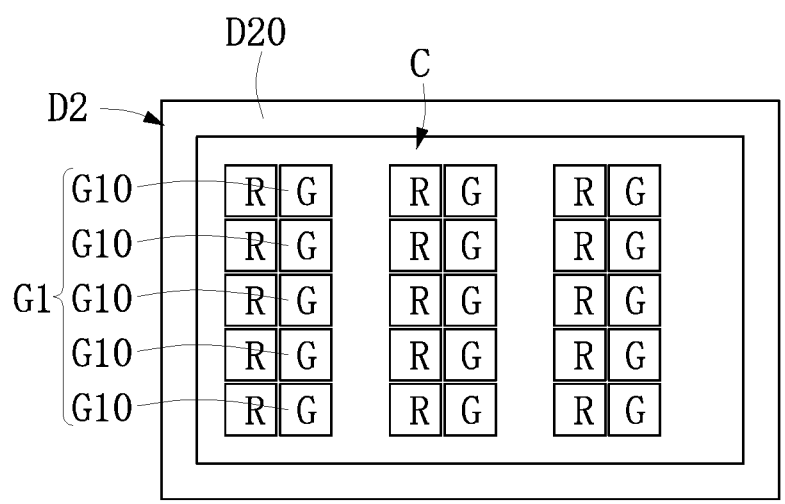
FIG. 6 shows a top schematic view of the $2^{nd}$, $5^{th}$ and $8^{th}$ red light emitting groups of the first semiconductor structure transmitted to circuit substrate by the chip capturing device according to the present disclosure.
Figure 7:
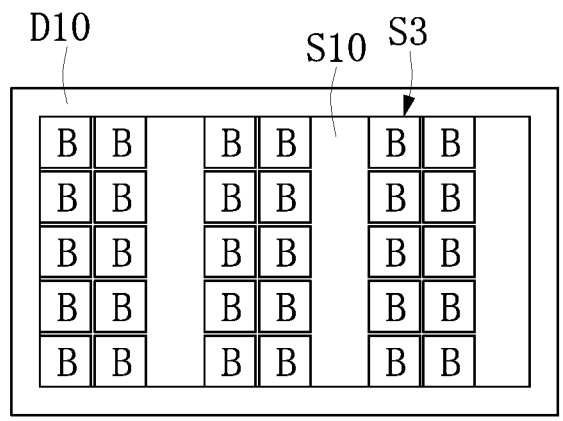
FIG. 7 shows a top schematic view of the $3^{rd}$, $6^{th}$ and $9^{th}$ red light emitting groups of the first semiconductor structure removed from the base layer by the chip capturing device according to the present disclosure.
Figure 10:
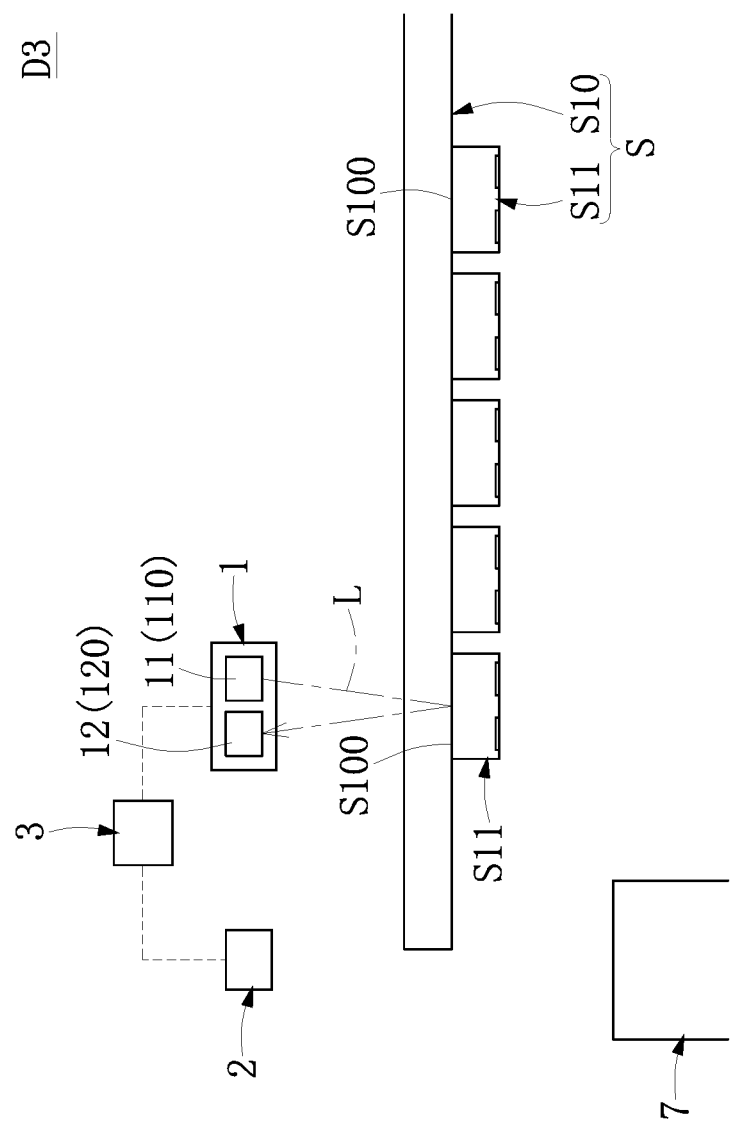
FIG. 10 shows a schematic view of a chip capturing device performing a position detecting step according to the first embodiment of the present disclosure.

Moreover, referring to FIG. 1, FIG. 4, and FIG. 10, the second carrier device D2 includes a second carrier platform D20 for carrying a circuit substrate C, and the chip capturing device D3 is used for moving the light emitting chip S11 from the base layer S10 to the circuit substrate C. For example, the chip capturing device D3 includes a chip capturing module that may be any type of suction device (such as a vacuum suction nozzle or a vacuum sucker) or any type of clamping device, but it is not meant to limit the scope of the present disclosure.

Figure 3:
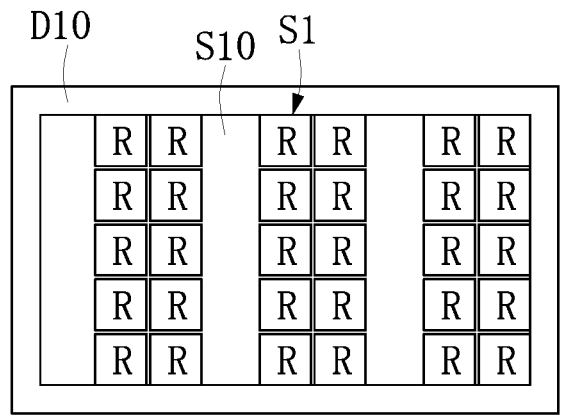
FIG. 3 shows a top schematic view of the $1^{st}$, $4^{th}$ and $7^{th}$ red light emitting groups of the first semiconductor structure removed from the base layer by the chip capturing device according to the present disclosure.

For example, referring to FIG. 3, FIG. 4, and FIG. 10, the red light emitting chip R10 of the first semiconductor structure S1 can be transmitted from the base layer S10 to the circuit substrate C. In addition, referring to FIG. 5, FIG. 6, and FIG. 10, the green light emitting chip G10 of the second semiconductor structure S2 can be transmitted from the base layer S10 to the circuit substrate C. Moreover, referring to FIG. 7, FIG. 8, and FIG. 10, the blue light emitting chip B10 of the third semiconductor structure S3 can be transmitted from the base layer S10 to the circuit substrate C.

As described above, referring to FIG. 3 and FIG. 4, the $1^{st}$, $4^{th}$ and $7^{th}$ red light emitting groups R1 of the first semiconductor structure S1 can be transmitted from the base layer S10 to the circuit substrate C by the chip capturing device D3. In addition, referring to FIG. 5 and FIG. 6, the $2^{nd}$, $5^{th}$ and $8^{th}$ green light emitting groups G1 of the second semiconductor structure S2 can be transmitted from the base layer S10 to the circuit substrate C by the chip capturing device D3. Moreover, referring to FIG. 7 and FIG. 8, the $3^{rd}$, $6^{th}$ and $9^{th}$ blue light emitting groups B1 of the third semiconductor structure S3 can be transmitted from the base layer S10 to the circuit substrate C by the chip capturing device D3.

Figure 8:
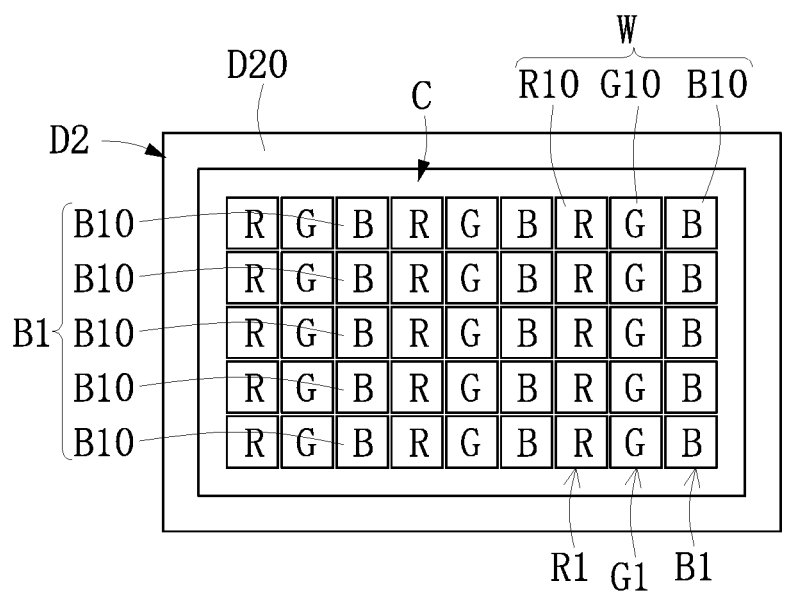
FIG. 8 shows a top schematic view of the $3^{rd}$, $6^{th}$ and $9^{th}$ red light emitting groups of the first semiconductor structure transmitted to circuit substrate by the chip capturing device according to the present disclosure.
Figure 9:
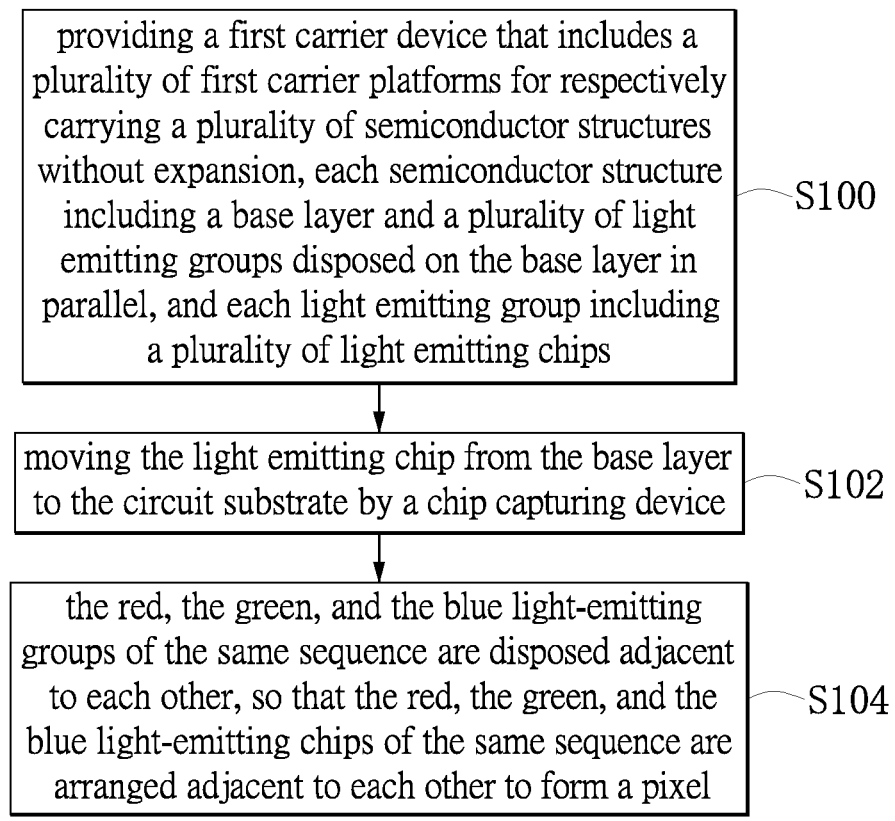
FIG. 9 shows a flowchart of a method for mounting chips according to the present disclosure.

Therefore, as shown in FIG. 8, the red light emitting group R1, the green light-emitting group G1, and the blue light-emitting group B1 of the same sequence are disposed adjacent to each other and electrically connected to the circuit substrate C, so that the red light-emitting chip R10, the green light-emitting chip G10, and the blue light-emitting chip B10 of the same sequence are arranged adjacent to each other to form a pixel W. That is to say, the $1^{st}$ red light emitting group R1, the $1^{st}$ green light-emitting group G1, and the $1^{st}$ blue light-emitting group B1 can be disposed adjacent to each other and electrically connected to the circuit substrate C, so that the red light-emitting chip R10, the green light-emitting chip G10, and the blue light-emitting chip B10 can be arranged adjacent to each other to form a pixel W.

Therefore, the red light emitting group R1, the green light-emitting group G1, and the blue light-emitting group B1 of the same sequence can be disposed adjacent to each other and electrically connected to the circuit substrate C due to the feature of "the chip capturing device D3 being used for moving the light emitting chip S11 from the base layer S10 to the circuit substrate C", so that the red light-emitting chip R10, the green light-emitting chip G10, and the blue light-emitting chip B10 of the same sequence can be arranged adjacent to each other to form a pixel W.

Referring to FIG. 1 to FIG. 10, the present disclosure further provides a method for mounting chips, including: firstly, providing a first carrier device D1 that includes a plurality of first carrier platforms D10 for respectively carrying a plurality of semiconductor structures S without expansion, each semiconductor structure S including a base layer S10 and a plurality of light emitting groups disposed on the base layer S10 in parallel, and each light emitting group including a plurality of light emitting chips S11 disposed on the base layer S10 (step S100); and then moving the light emitting chip S11 from the base layer S10 to the circuit substrate C by a chip capturing device D3 (step S102).

Therefore, the red light emitting group R1, the green light-emitting group G1, and the blue light-emitting group B1 of the same sequence can be disposed adjacent to each other and electrically connected to the circuit substrate C due to the feature of "moving the light emitting chip S11 from the base layer S10 to the circuit substrate C by a chip capturing device D3", so that the red light-emitting chip R10, the green light-emitting chip G10, and the blue light-emitting chip B10 of the same sequence can be arranged adjacent to each other to form a pixel W (step S104).

First Embodiment

Figure 11:
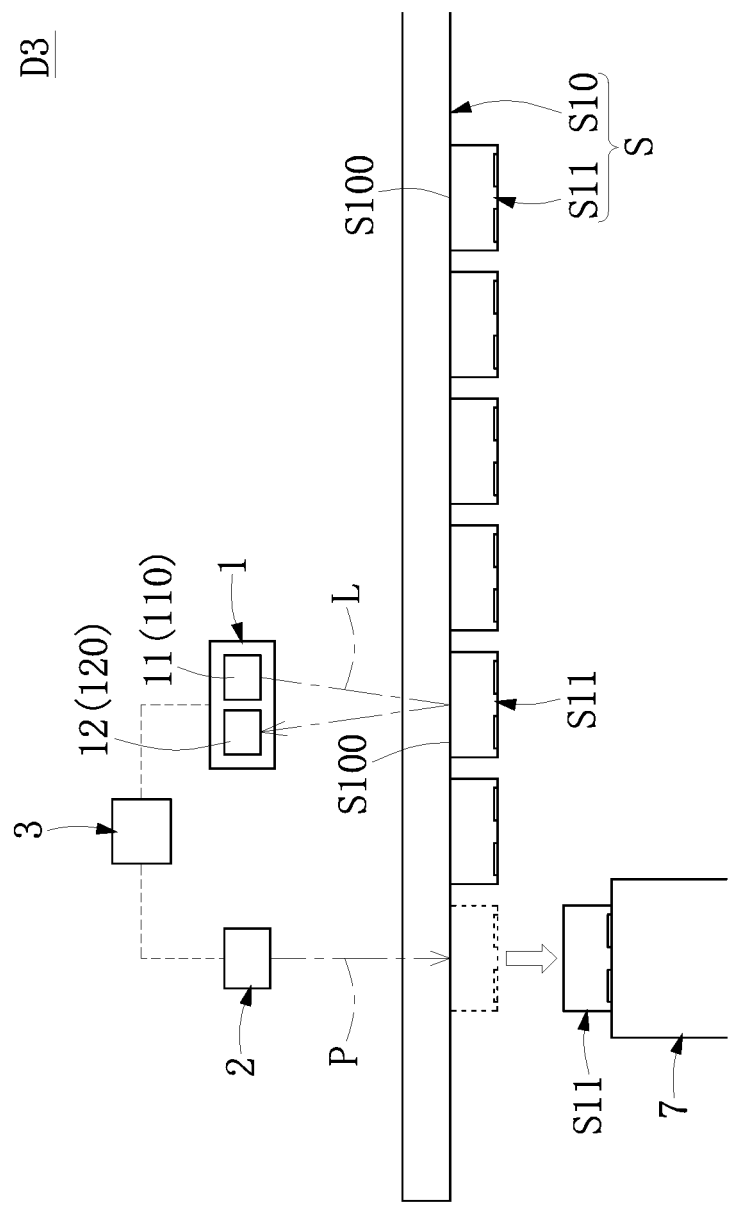
FIG. 11 shows a schematic view of the chip capturing device performing a position detecting step and a chip separating step according to the first embodiment of the present disclosure.
Figure 12:
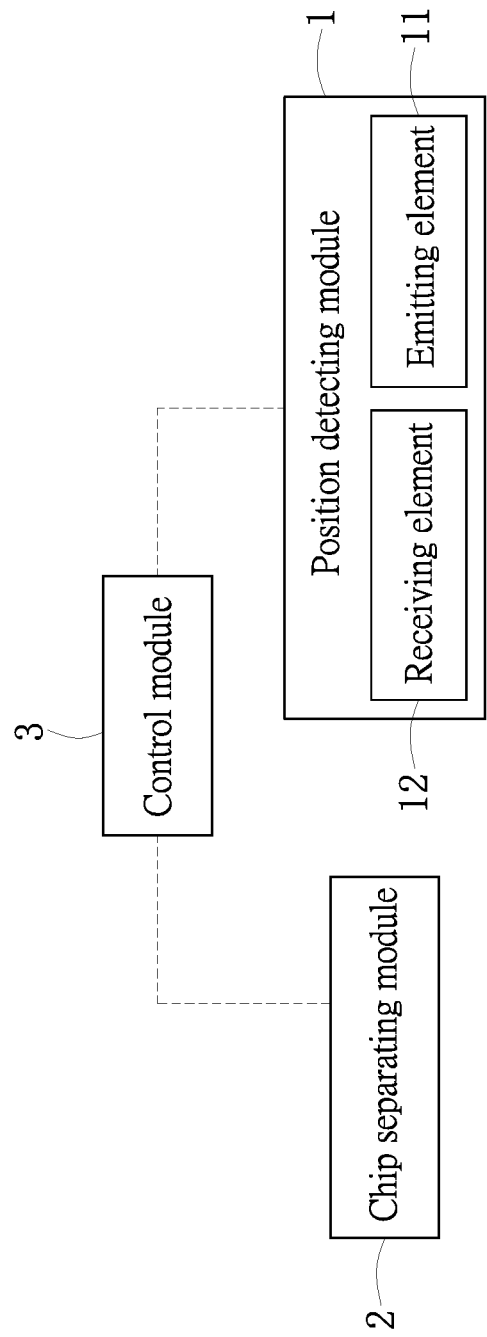
FIG. 12 shows a function block of the chip capturing device according to the first embodiment of the present disclosure.

Referring to FIG. 10 to FIG. 12, the first embodiment of the present disclosure provides a chip capturing device D3 including a position detecting module 1 and a chip separating module 2. The chip capturing device D3 can be applied to a semiconductor structure S that includes a base layer S10 and a plurality of light emitting chips S11 disposed on the base layer S10. For example, the base layer S10 may be a sapphire base layer, a silicon base layer, or a base layer of any material. In addition, the light emitting chips S11 can be connected with each other before cutting the light emitting chips S11, or the light emitting chips S11 can be separated from each other after cutting the light emitting chips S11 (as shown in the first embodiment). The light emitting chip S11 may be a GaN LED chip or any type of semiconductor LED chip, and each light emitting chip S11 has at least two pads (not shown) disposed on a top side thereof. However, the base layer S10 and the light emitting chips S11 used in the first embodiment are not meant to limit the scope of the present disclosure.

Referring to FIG. 10 and FIG. 11, the position detecting module 1 includes an emitting element 11 and a receiving element 12, and the chip separating module 2 is adjacent to or corresponds to the position detecting module 1. More particularly, the position detecting module 1 can provide a position signal of a contact interface S100 (or a contact surface) between the base layer S10 and the light emitting chip S11 by matching the emitting element 11 and the receiving element 12 (that is to say, the position detecting module 1 can be used to perform or execute a position detecting step). Therefore, referring to FIG. 10 and FIG. 11, a projection light source P generated by the chip separating module 2 is projected onto the contact interface S100 between the base layer S10 and the light emitting chip S11 according to the position signal so as to easily separate the light emitting chip S11 from the base layer S10 (that is to say, the chip separating module 2 can be used to perform a position separating step). Hence, after the projection light source P is projected onto the semiconductor structure S, the light emitting chip S11 can be easily separated from the base layer S10 due to the illumination of the projection light source P.

For example, referring to FIG. 10 and FIG. 11, the position detecting module 1 may be one of an optical position sensor and a sound position sensor. More particularly, the emitting element 11 may be a signal emitting element 110 (such as a signal emitter) for generating a detection signal L (such as an optical wave signal or a sound wave signal), and the receiving element 12 may be a signal receiving element 120 (such as a signal receiver) for receiving the detection signal L. In addition, the detection signal L generated by the signal emitting element 110 can be reflected by the semiconductor structure S and can be projected onto the signal receiving element 120 so as to provide the position signal of the contact interface S100 between the base layer S10 and the light emitting chip S11. Hence, referring to FIG. 10 and FIG. 11, the projection light source P generated by the chip separating module 2 can be projected onto the contact interface S100 between the base layer S10 and the light emitting chip S11 according to the position signal that has been received by the signal receiving element 120, so that the light emitting chip S11 can be easily separated from the base layer S10 due to the illumination of the projection light source P.

In conclusion, the position detecting module 1 can be used to provide a position signal of a contact interface S100 between the base layer S10 and the light emitting chip S11 by matching or pairing the emitting element 11 and the receiving element 12 in advance, and then a projection light source P generated by the chip separating module 2 can be precisely projected onto the contact interface S100 between the base layer S10 and the light emitting chip S11 according to the position signal. Hence, the light emitting chip S11 can be easily separated from the base layer S10 due to the illumination of the projection light source P.

It should be noted that the chip capturing device D3 of the present disclosure further includes a control module 3 electrically connected to the position detecting module 1 and the chip separating module 2 as shown in FIG. 1 and FIG. 3. In addition, referring to FIG. 10 to FIG. 11, the position detecting module 1 and the chip separating module 2 can be disposed beside or on the same side of the semiconductor structure S.

Second Embodiment

Figure 13:
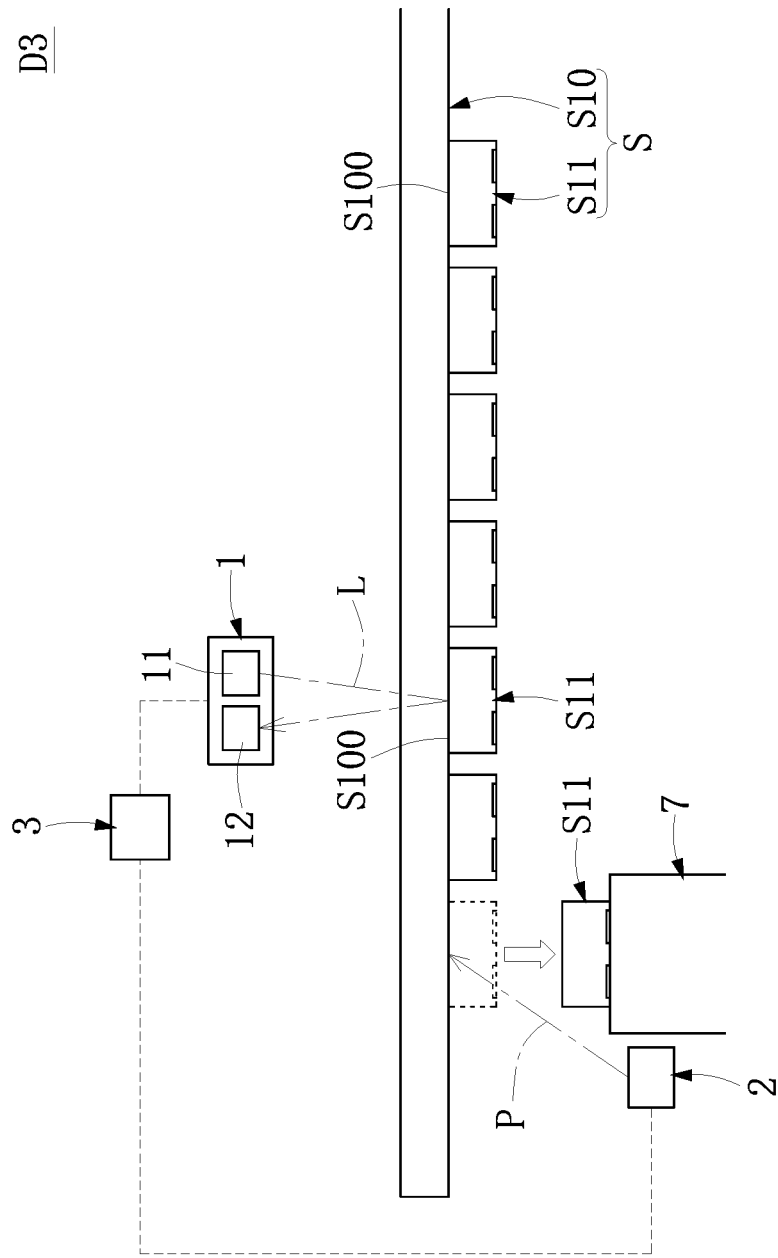
FIG. 13 shows a schematic view of the chip capturing device performing a position detecting step and a chip separating step according to the second embodiment of the present disclosure.

Referring to FIG. 13, the second embodiment of the present disclosure provides a chip capturing device D3 including a position detecting module 1 and a chip separating module 2. Comparing FIG. 13 with FIG. 11, the difference between the second embodiment and the first embodiment is as follows: in the second embodiment, the position detecting module 1 and the chip separating module 2 can be respectively disposed beside two different sides of the semiconductor structure S. For example, the position detecting module 1 can be disposed above the semiconductor structure S, and the chip separating module 2 can be disposed under the semiconductor structure S.

It should be noted that the light emitting chip S11 can also be respectively detected and separated at the same position. That is to say, the position detecting module 1 and the chip separating module 2 can be respectively disposed beside or at two different sides of the semiconductor structure S, so that the light emitting chip S11 can be respectively detected and separated at the same position as shown in FIG. 13.

Third Embodiment

Figure 14:
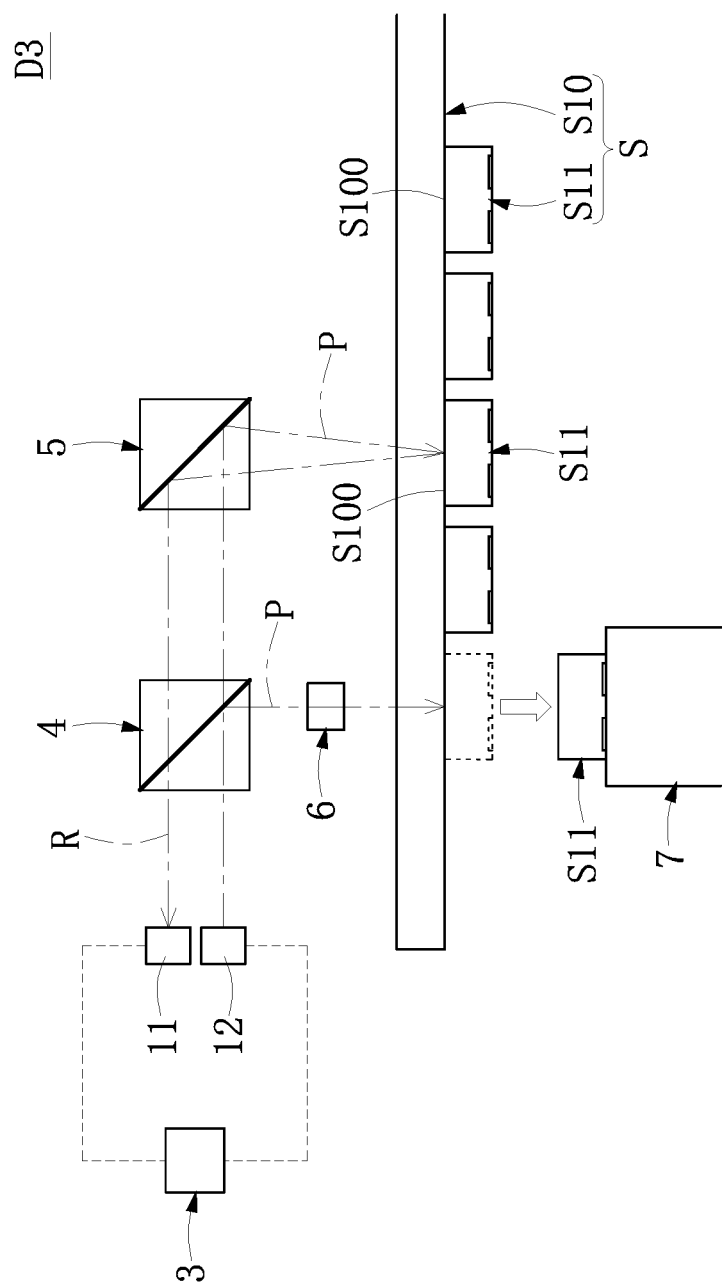
FIG. 14 shows a schematic view of the chip capturing device performing a position detecting step and a chip separating step according to the third embodiment of the present disclosure.

Referring to FIG. 14, the third embodiment of the present disclosure provides a chip capturing device D3. Comparing FIG. 14 with FIG. 11, the difference between the third embodiment and the first embodiment is as follows: the chip capturing device D3 of the third embodiment includes an emitting element 11 for generating a projection light source P, a receiving element 12 adjacent to the emitting element 11, and a control module 3 electrically connected to the emitting element 11 and the receiving element 12.

More particularly, the projection light source P generated by the emitting element 11 can be reflected by the semiconductor structure S and then projected onto the receiving element 12 so as to provide a position signal of a contact interface S100 between the base layer S10 and the light emitting chip S11. Therefore, according to the position signal, the projection light source P generated by the emitting chip 11 can be precisely projected onto the contact interface S100 between the base layer S10 and the light emitting chip S11 so as to separate the light emitting chip S11 from the base layer S10 easily.

More particularly, the chip capturing device D3 further includes a first prism 1 adjacent to the emitting element 11 and the receiving element 12, a second prism 5 adjacent to the first prism 4, and a signal amplifier 6 adjacent to the first prism 4. In addition, the projection light source P generated by the emitting element 11 can sequentially pass the first prism 4 and the second prism 5 and then be projected onto the semiconductor structure S. The projection light source P can be reflected by the semiconductor structure S to form a reflection light source R, and the reflection light source R can sequentially pass through the second prism 5 and the first prism 4 and then be projected onto the receiving element 12. That is to say, the projection light source P generated by the emitting element 11 can be reflected by the semiconductor structure S and then projected onto the receiving element 12. Therefore, according to the position signal, the projection light source P generated by the emitting element 11 can sequentially pass the first prism 4 and the signal amplifier 6 and then be precisely projected onto the contact interface S100 between the base layer S10 and the light emitting chip S11, so that the light emitting chip S11 can be easily separated from the base layer S10 due to the illumination of the projection light source P.

Fourth Embodiment

Figure 15:
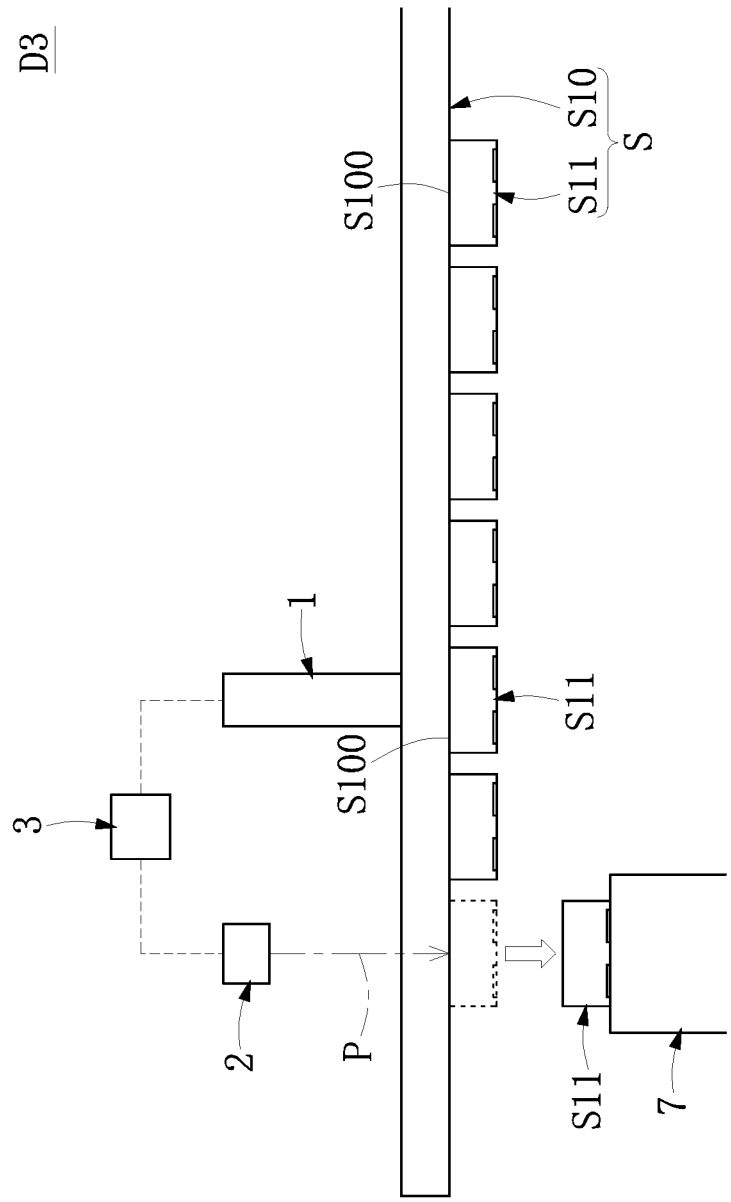
FIG. 15 shows a schematic view of the chip capturing device performing a position detecting step and a chip separating step according to the fourth embodiment of the present disclosure.

Referring to FIG. 15, the fourth embodiment of the present disclosure provides a chip capturing device D3 including a position detecting module 1 and a chip separating module 2. Comparing FIG. 15 with FIG. 11, the difference between the fourth embodiment and the first embodiment is as follows: in the fourth embodiment, the chip capturing device D3 includes a position detecting module 1, a chip separating module 2, and a control module 3, and the position detecting module 1 may be a contact position sensor.

More particularly, the position detecting module 1 can contact the semiconductor structure S so as to provide a position signal of a contact interface S100 between the base layer S10 and the light emitting chip S11. For example, when the base layer S10 causes warpage, the position detecting module 1 can be used to contact the base layer S10 of the semiconductor structure S so as to know a position of a contact interface S100 between the base layer S10 and the light emitting chip S11. In addition, the chip separating module 2 is adjacent to and corresponds to the position detecting module 1, and the control module 3 is electrically connected to the position detecting module 1 and the chip separating module 2.

Therefore, a projection light source P generated by the chip separating module 2 can be projected onto the contact interface S100 between the base layer S10 and the light emitting chip S11 according to the position signal so as to easily separate the light emitting chip S11 from the base layer S10.

It should be noted that the position detecting module 1 and the chip separating module 2 can be disposed beside or on the same side of the semiconductor structure S1 (as shown in FIG. 15), or the position detecting module 1 and the chip separating module 2 can be respectively disposed beside or at two different sides of the semiconductor structure S1, according to different requirements.

Therefore, the red light emitting group R1, the green light-emitting group G1, and the blue light-emitting group B1 of the same sequence are disposed adjacent to each other and electrically connected to the circuit substrate C due to the feature of "the chip capturing device D3 being used for moving the light emitting chip S11 from the base layer S10 to the circuit substrate C" or "moving the light emitting chip S11 from the base layer S10 to the circuit substrate C by a chip capturing device D3", so that the red light-emitting chip R10, the green light-emitting chip G10, and the blue light-emitting chip B10 of the same sequence are arranged adjacent to each other to form a pixel W.

The aforementioned descriptions merely represent the preferred embodiments of the present disclosure, without any intention to limit the scope of the present disclosure which is fully described only within the following claims. Various equivalent changes, alterations or modifications based on the claims of the present disclosure are all, consequently, viewed as being embraced by the scope of the present disclosure.

What is claimed is:

1. A chip mounting system, comprising:
    a first carrier device including a plurality of first carrier platforms for respectively carrying a plurality of semiconductor structures, wherein each semiconductor structure includes a base layer and a plurality of light emitting groups disposed on the base layer in parallel, and each light emitting group includes a plurality of light emitting chips disposed on the base layer;
    a second carrier device including a second carrier platform for carrying a circuit substrate; and
    a chip capturing device for moving the light emitting chip from the base layer to the circuit substrate;
    wherein the first carrier device, the second carrier device, and the chip capturing device are disposed on the same production line, and the semiconductor structures are divided into a first semiconductor structure, a second semiconductor structure and a third semiconductor structure;
    wherein each light emitting group of the first semiconductor structure is a red light emitting group, each light emitting chip of the first semiconductor structure is a red light emitting chip, and the sequence of the red light emitting groups of the first semiconductor structure is based upon the arithmetical series with a common difference of 1 being sequentially defined as the $1^{st}$, $2^{nd}$, $3^{rd}$, ... $n^{th}$;
    wherein each light emitting group of the second semiconductor structure is a green light emitting group, each light emitting chip of the second semiconductor structure is a green light emitting chip, and the sequence of the green light emitting groups of the second semiconductor structure is based upon the arithmetical series with a common difference of 1 being sequentially defined as the $1^{st}$, $2^{nd}$, $3^{rd}$, ... $n^{th}$;
    wherein each light emitting group of the third semiconductor structure is a blue light emitting group, each light emitting chip of the third semiconductor structure is a blue light emitting chip, and the sequence of the blue light emitting groups of the third semiconductor structure is based upon the arithmetical series with a common difference of 1 being sequentially defined as the $1^{st}$, $2^{nd}$, $3^{rd}$, ... $n^{th}$;
    wherein the red light emitting chip of the first semiconductor structure is transmitted from the base layer to the circuit substrate, the green light emitting chip of the second semiconductor structure is transmitted from the base layer to the circuit substrate, and the blue light emitting chip of the third semiconductor structure is transmitted from the base layer to the circuit substrate;
    wherein the red light emitting group, the green light-emitting group, and the blue light-emitting group of the same sequence are disposed adjacent to each other and electrically connected to the circuit substrate, so that the red light-emitting chip, the green light-emitting chip, and the blue light-emitting chip of the same sequence are arranged adjacent to each other to form a pixel.

2. The chip mounting system of claim 1, wherein the chip capturing device includes:
    a position detecting module including an emitting element and a receiving element; and
    a chip separating module corresponding to the position detecting module;
    wherein the position detecting module provides a position signal of a contact interface between the base layer and the light emitting chip by matching the emitting element and the receiving element;
    wherein a projection light source generated by the chip separating module is projected onto the contact interface between the base layer and the light emitting chip according to the position signal so as to easily separate the light emitting chip from the base layer.

3. The chip mounting system of claim 2, wherein the emitting element is a signal emitting element for generating a detection signal, and the receiving element is a signal receiving element for receiving the detection signal, wherein the detection signal generated by the signal emitting element is reflected by the semiconductor structure and projected onto the signal receiving element so as to provide the position signal of the contact interface between the base layer and the light emitting chip, wherein the base layer is one of a quartz base layer, a glass base layer, a sapphire base layer and a silicon base layer, and the light emitting chip is a GaN LED chip.

4. The chip mounting system of claim 3, wherein the chip capturing device includes a control module electrically connected to the position detecting module and the chip separating module, wherein the position detecting module is one of an optical position sensor and a sound position sensor, and the position detecting module and the chip separating module are disposed on the same side or respectively disposed at two different sides of the semiconductor structure.

5. The chip mounting system of claim 1, wherein the chip capturing device includes:
    an emitting element for generating a projection light source; and
    a receiving element adjacent to the emitting element;
    wherein the projection light source generated by the emitting element is reflected by the semiconductor structure and projected onto the receiving element so as to provide a position signal of a contact interface between the base layer and the light emitting chip;
    wherein the projection light source generated by the emitting chip is projected onto the contact interface between the base layer and the light emitting chip according to the position signal so as to easily separate the light emitting chip from the base layer.

6. The chip mounting system of claim 5, wherein the chip capturing device includes:
    a first prism adjacent to the emitting element and the receiving element;
    a second prism adjacent to the first prism; and
    a signal amplifier adjacent to the first prism;
    wherein the projection light source generated by the emitting element sequentially passes the first prism and the second prism and is projected onto the semiconductor structure, the projection light source is reflected by the semiconductor structure to form a reflection light source, and the reflection light source sequentially passes through the second prism and the first prism and is projected onto the receiving element;

wherein the projection light source generated by the emitting element sequentially passes the first prism and the signal amplifier and is projected onto the contact interface between the base layer and the light emitting chip.

7. The chip mounting system of claim 1, wherein the chip capturing device includes:
    a position detecting module contacting the semiconductor structure so as to provide a position signal of a contact interface between the base layer and the light emitting chip; and
    a chip separating module corresponding to the position detecting module;
    wherein a projection light source generated by the chip separating module is projected onto the contact interface between the base layer and the light emitting chip according to the position signal so as to easily separate the light emitting chip from the base layer.

8. The chip mounting system of claim 7, wherein the chip capturing device includes a control module electrically connected to the position detecting module and the chip separating module, wherein the position detecting module is a contact position sensor, and the position detecting module and the chip separating module are disposed on the same side or respectively disposed at two different sides of the semiconductor structure.

9. A chip mounting system, comprising:
    a first carrier device including a plurality of first carrier platforms for respectively carrying a plurality of semiconductor structures, wherein each semiconductor structure includes a base layer and a plurality of light emitting chips disposed on the base layer;
    a second carrier device including a second carrier platform for carrying a circuit substrate; and
    a chip capturing device for moving the light emitting chip from the base layer to the circuit substrate;
    wherein the first carrier device, the second carrier device, and the chip capturing device are disposed on the same production line, and the semiconductor structures are divided into a first semiconductor structure, a second semiconductor structure and a third semiconductor structure;
    wherein each light emitting chip of the first semiconductor structure is a red light emitting chip, each light emitting chip of the second semiconductor structure is a green light emitting chip, and each light emitting chip of the third semiconductor structure is a blue light emitting chip;
    wherein the red light emitting chip of the first semiconductor structure is transmitted from the base layer to the circuit substrate, the green light emitting chip of the second semiconductor structure is transmitted from the base layer to the circuit substrate, and the blue light emitting chip of the third semiconductor structure is transmitted from the base layer to the circuit substrate;
    wherein the red light-emitting chip, the green light-emitting chip, and the blue light-emitting chip are disposed adjacent to each other to form a pixel.

10. A method for mounting chips, comprising:
    providing a first carrier device that includes a plurality of first carrier platforms without expansion for respectively carrying a plurality of semiconductor structures, wherein each semiconductor structure includes a base layer and a plurality of light emitting groups disposed on the base layer in parallel, and each light emitting group includes a plurality of light emitting chips disposed on the base layer; and
    moving the light emitting chip from the base layer to the circuit substrate by a chip capturing device;
    wherein the first carrier device and the chip capturing device are disposed on the same production line, and the semiconductor structures are divided into a first semiconductor structure, a second semiconductor structure and a third semiconductor structure;
    wherein each light emitting group of the first semiconductor structure is a red light emitting group, each light emitting chip of the first semiconductor structure is a red light emitting chip, and the sequence of the red light emitting groups of the first semiconductor structure is based upon the arithmetical series with a common difference of 1 being sequentially defined as the $1^{st}$, $2^{nd}$, $3^{rd}$, ... $n^{th}$;
    wherein each light emitting group of the second semiconductor structure is a green light emitting group, each light emitting chip of the second semiconductor structure is a green light emitting chip, and the sequence of the green light emitting groups of the second semiconductor structure is based upon the arithmetical series with a common difference of 1 being sequentially defined as the $1^{st}$, $2^{nd}$, $3^{rd}$, ... $n^{th}$;
    wherein each light emitting group of the third semiconductor structure is a blue light emitting group, each light emitting chip of the third semiconductor structure is a blue light emitting chip, and the sequence of the blue light emitting groups of the third semiconductor structure is based upon the arithmetical series with a common difference of 1 being sequentially defined as the $1^{st}$, $2^{nd}$, $3^{rd}$, ... $n^{th}$;
    wherein the red light emitting chip of the first semiconductor structure is transmitted from the base layer to the circuit substrate, the green light emitting chip of the second semiconductor structure is transmitted from the base layer to the circuit substrate, and the blue light emitting chip of the third semiconductor structure is transmitted from the base layer to the circuit substrate;
    wherein the red light emitting group, the green light-emitting group, and the blue light-emitting group of the same sequence are disposed adjacent to each other and electrically connected to the circuit substrate, so that the red light-emitting chip, the green light-emitting chip, and the blue light-emitting chip of the same sequence are arranged adjacent to each other to form a pixel.

* * * * *